US009136486B2

(12) United States Patent
Suzuki et al.

(10) Patent No.: US 9,136,486 B2
(45) Date of Patent: Sep. 15, 2015

(54) COMPOSITION FOR ORGANIC SEMICONDUCTOR INSULATING FILMS, AND ORGANIC SEMICONDUCTOR INSULATING FILM

(71) Applicant: TOAGOSEI CO., LTD., Minato-ku (JP)

(72) Inventors: Hiroshi Suzuki, Nagoya (JP); Akinori Kitamura, Nagoya (JP); Takashi Hamada, Narashino (JP)

(73) Assignee: TOAGOSEI CO., LTD., Minato-ku (JP)

( * ) Notice: Subject to any disclaimer, the term of this patent is extended or adjusted under 35 U.S.C. 154(b) by 0 days.

(21) Appl. No.: 14/352,469

(22) PCT Filed: Nov. 13, 2012

(86) PCT No.: PCT/JP2012/079426
§ 371 (c)(1),
(2) Date: Apr. 17, 2014

(87) PCT Pub. No.: WO2013/009460
PCT Pub. Date: Jul. 4, 2013

(65) Prior Publication Data
US 2014/0326980 A1    Nov. 6, 2014

(30) Foreign Application Priority Data
Dec. 26, 2011 (JP) ................. 2011-284363

(51) Int. Cl.
*H01L 51/00* (2006.01)
*C08G 77/04* (2006.01)
(Continued)

(52) U.S. Cl.
CPC .......... *H01L 51/0094* (2013.01); *C08G 77/045* (2013.01); *C08G 77/14* (2013.01); *H01L 51/052* (2013.01)

(58) Field of Classification Search
None
See application file for complete search history.

(56) References Cited

U.S. PATENT DOCUMENTS 5,463,084 A * 10/1995 Crivello et al. ............... 549/214
5,877,080 A    3/1999 Aoi et al.
(Continued)

FOREIGN PATENT DOCUMENTS

JP    9-219448    8/1997
JP    2009-209358    9/2009
(Continued)

OTHER PUBLICATIONS

International Search Report issued Jan. 22, 2013 in PCT/JP2012/079426.

*Primary Examiner* — Robert S Loewe
(74) *Attorney, Agent, or Firm* — Oblon, McClelland, Maier & Neustadt, L.L.P.

(57) ABSTRACT

The purpose of the invention is to provide: a composition for an organic semiconductor insulating film, which is capable of forming an insulating film that exhibits excellent hydrophobicity and smoothness of the surface, while having excellent electrical stability; and an organic semiconductor insulating film obtained by using the composition for an organic semiconductor insulating film. The present composition contains a polysiloxane and an organic polymer compound. The polysiloxane is a polyhedral silsesquioxane having an oxetanyl group and/or an oxetanyl group containing silicon compound represented by the following formula (1). In the formula (1), each of $R^1$-$R^3$ independently represents a monovalent organic group (provided that at least one of $R^1$-$R^3$ is a monovalent organic group having an oxetanyl group); and each of v, w, x and y independently represents 0 or a positive number (provided that w and at least one of v, x and y are positive numbers).

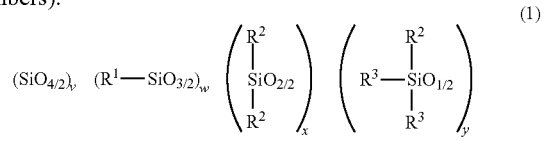

12 Claims, 3 Drawing Sheets

(51) Int. Cl.
*H01L 51/05* (2006.01)
*C08G 77/14* (2006.01)

(56) References Cited

U.S. PATENT DOCUMENTS

| | | | | |
|---|---|---|---|---|
| 6,121,342 | A * | 9/2000 | Suzuki et al. | 522/148 |
| 7,576,142 | B2 * | 8/2009 | Tauchi et al. | 522/168 |
| 2009/0152504 | A1 * | 6/2009 | Komuro et al. | 252/500 |
| 2009/0256138 | A1 | 10/2009 | Wu et al. | |
| 2010/0155989 | A1 * | 6/2010 | Ishii et al. | 264/225 |
| 2010/0193961 | A1 * | 8/2010 | Konishi et al. | 257/773 |
| 2010/0256313 | A1 * | 10/2010 | Nakamura et al. | 525/476 |
| 2011/0054063 | A1 | 3/2011 | Ooike et al. | |
| 2011/0195249 | A1 * | 8/2011 | Song et al. | 428/345 |
| 2011/0260283 | A1 | 10/2011 | Wu et al. | |
| 2012/0018761 | A1 * | 1/2012 | Honda | 257/98 |
| 2012/0052296 | A1 * | 3/2012 | Ikeno et al. | 428/396 |
| 2012/0295199 | A1 * | 11/2012 | Takeyama et al. | 430/280.1 |
| 2012/0321738 | A1 * | 12/2012 | Ishii et al. | 425/385 |
| 2013/0177849 | A1 * | 7/2013 | Takeyama et al. | 430/280.1 |

FOREIGN PATENT DOCUMENTS

| | | |
|---|---|---|
| JP | 2009-260346 | 11/2009 |
| JP | 2010-74188 | 4/2010 |
| JP | 2010-83917 | 4/2010 |
| JP | 2011-233884 | 11/2011 |

OTHER PUBLICATIONS

Naomasa Furuta, et al.,"Silsesquioxane Derivatives Photocurable SQ Series", "Silsesquioxane Yudotai 'Hikari Kokagata SQ Series'", Toa Gosei Group Kenkyu Nenpo Trend, 2009, pp. 27-30, http://www2.toagosei.co.jp/develop/trend/No12/no12_5.pdf> (with English translation).

Office Action issued Nov. 11, 2014 in Japanese Patent Application No. 2013-551528 (with English language translation).

* cited by examiner

F I G. 3
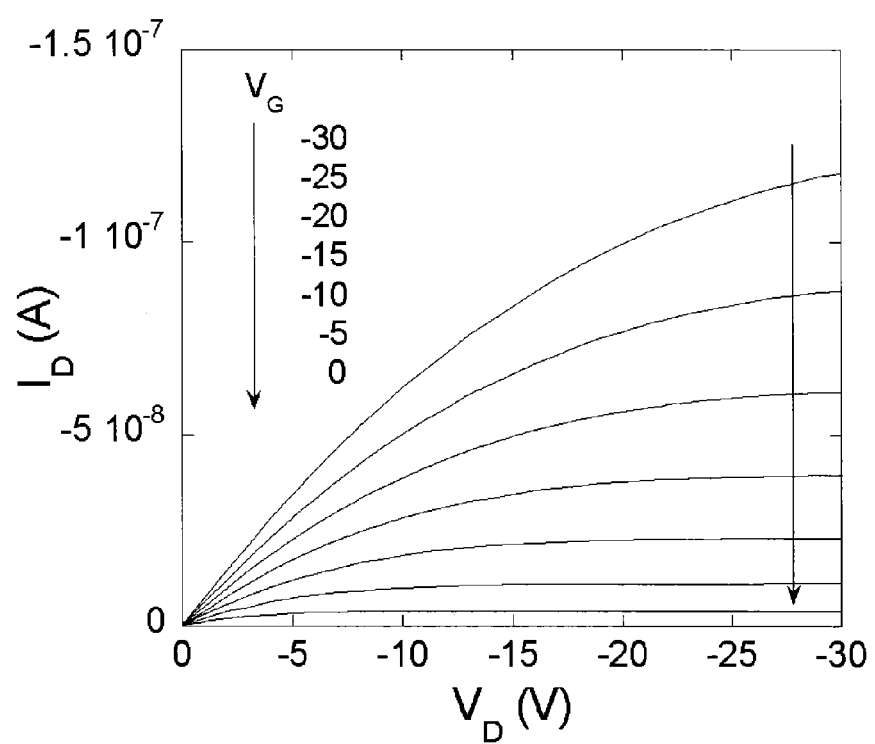

COMPOSITION FOR ORGANIC SEMICONDUCTOR INSULATING FILMS, AND ORGANIC SEMICONDUCTOR INSULATING FILM

FIELD OF THE INVENTION

The present invention relates to a composition for an organic semiconductor insulating film and an organic semiconductor insulating film. More specifically, the invention relates to a composition for an organic semiconductor insulating film which enables to form an insulating film having excellent hydrophobicity and smoothness of the surface and excellent electric stability and to an organic semiconductor insulating film that is obtained by the composition.

BACKGROUND ART

An organic field effect transistor (OFET) is such that an organic semiconductor is used in an active layer, and is expected to be applied to flexible electronics such as an active matrix display and an electronic paper. OFET is a basic constituent unit of these flexible electronics, and has a principle of controlling the current flowing between a drain electrode and a source electrode by the voltage applied to the gate electrode. When the gate voltage is increased, the amount of the current flowing between the drain and source electrodes is also increased. For high-speed operation of a transistor, high electric charge carrier mobility of a semiconductor and high on/off current ratio are needed. Coating-type OFETs, which can be produced by a solution process such as spin coating or printing, have attracted attention since they can realize more flexibility, a lower cost and a larger area which have conventionally been unattainable, and organic semiconductors which affect the performance of OFETs have been actively developed.

Device characteristics and operation stability of OFETs are known to be affected also by a gate insulating film because electric charge carriers are produced and moved in the vicinity of an interface between the organic semiconductor and the gate insulating film, and the performance aspect of the gate insulating film is also regarded as important. Especially, the basic characteristics of OFETs, such as mobility, threshold voltage and on/off ratio, are known to strongly depend on the smoothness and surface state of the gate insulating film. The respective properties such as the following are required of the gate insulating film: (1) hydrophobicity of the film surface; (2) high smoothness of the film surface; and (3) high insulation properties.

Insulating films including polymethylmethacrylate (PMMA), polyvinylphenol (PVP), polyimide or the like are publicly known as a gate insulating film. In addition, an insulating film including PVP and poly(melamine-co-formaldehyde) is known (see Patent Document 1).

PRIOR TECHNICAL DOCUMENT

Patent Document

[Patent Document 1] JP-A 2010-74188

SUMMARY OF THE INVENTION

Problems that the Invention is to Solve

However, conventional insulating films cannot necessarily be said to be optimum materials in terms of hydrophobicity and smoothness and electric stability of the surface, and further improvement in performance is demanded currently. In addition, a novel material having the above performance necessary as an insulating film and allowing for grant of new physical properties and regulation is demanded currently.

The present invention has been made in light of the above current situation, and aims at providing a composition for an organic semiconductor insulating film which enables to form an insulating film having excellent hydrophobicity and smoothness of the surface and excellent electric stability, and an organic semiconductor insulating film employing the same.

Means for Solving the Problems

The present invention is as follows.
[1] A composition for an organic semiconductor insulating film characterized by comprising (A) a polysiloxane and (B) an organic polymer compound,
wherein the polysiloxane (A) is at least one of a cage-shaped silsesquioxane having an oxetanyl group, and a silicon compound that has an oxetanyl group and that is represented by the following formula (1):

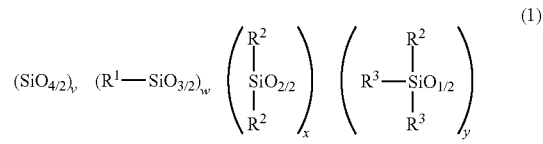

wherein $R^1$, $R^2$ and $R^3$ each independently represent a monovalent organic group having an alkyl group having 1 to 6 carbon atoms, an aralkyl group having 7 to 10 carbon atoms, an aryl group having 6 to 10 carbon atoms, a (meth)acryloyl group, an epoxy group or an oxetanyl group (provided that at least one of $R^1$, $R^2$ and $R^3$ is a monovalent organic group having an oxetanyl group); the monovalent organic group may be substituted by a halogen atom, a hydroxy group, an alkoxy group, an aryloxy group, an aralkyloxy group or an oxy group; the respective groups $R^2$ may be identical to or different from each other; the respective groups $R^3$ may be identical to or different from each other; w represents a positive number; v, x and y each independently represent 0 or a positive number (provided that at least one of v, x and y is a positive number).
[2] The composition for an organic semiconductor insulating film according to [1] above, further comprising a curing catalyst.
[3] An organic semiconductor film produced by using the composition for an organic semiconductor insulating film according to [1] or [2] above.

Effect of the Invention

The composition for an organic semiconductor insulating film of the present invention enables to form an insulating film having excellent hydrophobicity and smoothness of the surface and excellent electric stability. Further, an insulating film including a hybrid of an organic polymer with an inorganic polymer can be formed, so that grant of new physical properties and regulation are made possible.

Additionally, the organic semiconductor insulating film of the present invention is formed by using a specific composition for an organic semiconductor insulating film, and thus has excellent hydrophobicity and smoothness of the surface and excellent electric stability. Further, since the organic semiconductor insulating film has organic nature and inorganic nature in combination, so that grant of new physical properties and regulation are made possible.

BRIEF DESCRIPTION OF THE DRAWINGS

FIG. 3 is a graph showing a transistor characteristic (output characteristic).

EMBODIMENTS FOR CARRYING OUT THE INVENTION

Figure 1:
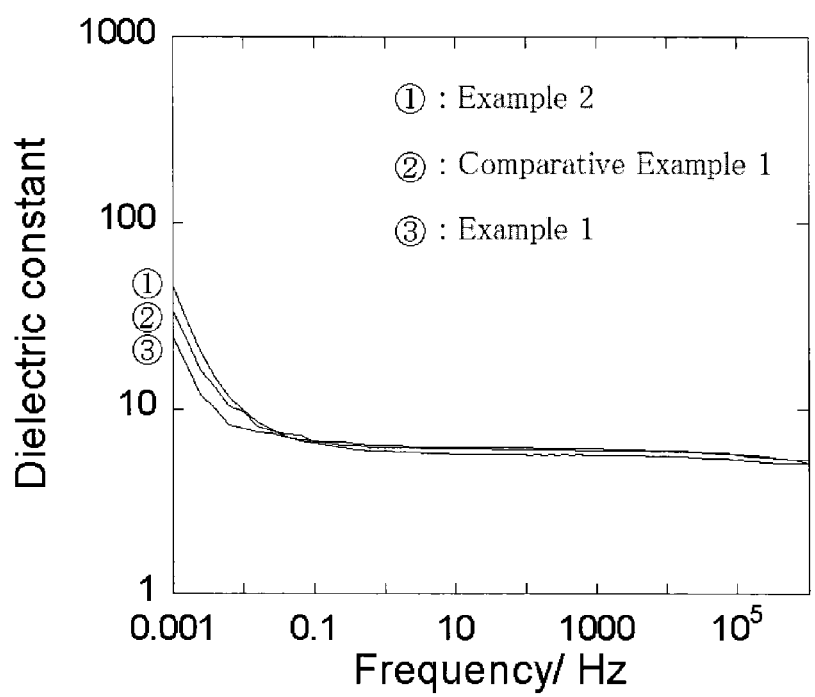
FIG. 1 is a graph showing the relation between dielectric constant and frequency.

Hereinafter, the present invention is described in detail.

1. Composition for Organic Semiconductor Insulating Film

The composition for an organic semiconductor insulating film of the present invention contains a specific polysiloxane (hereinafter also referred to as "polysiloxane (A)") and an organic polymer compound (hereinafter also referred to as "organic polymer (B)").

1-1. Polysiloxane (A)

The polysiloxane (A) is at least one of a cage-shaped silsesquioxane having an oxetanyl group (hereinafter also referred to as "OX group-containing cage-shaped silsesquioxane") and a silicon compound that has an oxetanyl group and that is represented by the above formula (1) (hereinafter also referred to as "OX group-containing silicon compound").

<OX Group-Containing Cage-Shaped Silsesquioxane>

The OX group-containing cage-shaped silsesquioxane is not particularly limited so long as it has, as a main backbone, a publicly known cage-shaped silsesquioxane such as (a) hexahedron in which Si is present at each of the eight apexes of an approximately quadratic prism body, (b) heptahedron in which Si is present at each of the ten apexes of an approximately pentagonal prism body, and (c) octahedron in which Si is present at each of the twelve apexes of an approximately hexagonal prism, and has an oxetanyl group. Such silsesquioxanes having a cage-shaped structure are preferred because no residual silanol is normally generated at a time of synthesis, and they do not affect the smoothness and hydrophobicity of the resultant thin film.

Among others, the OX group-containing cage-shaped silsesquioxane is preferably a compound represented by the following formula (A1) having main backbone (a) as described above. Further, a compound represented by the following Formula (A1-1) is particularly preferred among the compounds represented by the formula (A1).

The compound of the formula (A1) (especially, formula (A1-1)) enables easy formation of an insulating film having excellent hydrophobicity and smoothness of the surface and excellent electric stability. Further, this compound is preferred from the viewpoint of the advantage that the resultant composition can be cured at a lower temperature (especially, 150° C. to 200° C.)

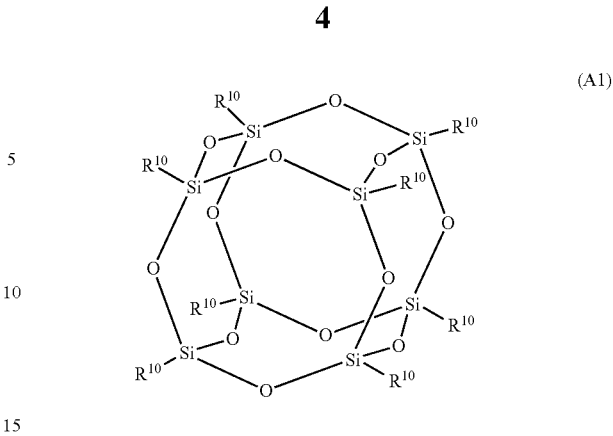

In the formula (A1), $R^{10}$s are independently a monovalent organic group including an alkyl group having 1 to 6 carbon atoms, an aralkyl group having 7 to 10 carbon atoms, an aryl group having 6 to 10 carbon atoms, a (meth)acryloyl group, an epoxy group or an oxetanyl group, provided that at least one $R^{10}$ is a monovalent organic group having an oxetanyl group. The monovalent organic group may be substituted by a halogen atom, a hydroxy group, an alkoxy group, an aryloxy group, an aralkyloxy group or an oxy group, and the respective groups $R^{10}$ may be identical to or different from each other.

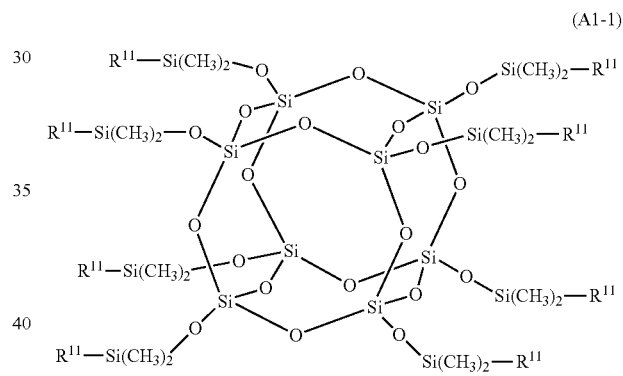

In the formula (A1-1), $R^{11}$s are independently a monovalent organic group including an alkyl group having 1 to 6 carbon atoms, an aralkyl group having 7 to 10 carbon atoms, an aryl group having 6 to 10 carbon atoms or an oxetanyl group, provided that at least one $R^{11}$ is a monovalent organic group having an oxetanyl group. The monovalent organic group may be substituted by a halogen atom, a hydroxy group, an alkoxy group, an aryloxy group, an aralkyloxy group or an oxy group, and the respective groups $R^{11}$ may be identical to or different from each other.

The monovalent organic group for $R^{10}$ in the above formula (A1) and $R^{11}$ for the above formula (A1-1) may each be merely an alkyl group having 1 to 6 carbon atoms, an aralkyl group having 7 to 10 carbon atoms, an aryl group having 6 to 10 carbon atoms or an oxetanyl group.

The alkyl group, aralkyl group, aryl group and oxetanyl group in the monovalent organic group for $R^{10}$ and $R^{11}$ may be substituted by at least one of a halogen atom, a hydroxy group, an alkoxy group, an aryloxy group, an aralkyloxy group and an oxy group (=O).

The alkyl group having 1 to 6 carbon atoms and aralkyl group having 7 to 10 carbon atoms for $R^{10}$ and $R^{11}$ may be in a straight chain form or a branched form, or may have a cyclic structure.

The alkyl group having 1 to 6 carbon atoms in $R^{10}$ and $R^{11}$ is preferably an alkyl group having 1 to 4 carbon atoms, and more preferably a methyl group.

The aralkyl group having 7 to 10 carbon atoms in $R^{10}$ and $R^{11}$ is preferably a phenylalkyl group, and more preferably a benzyl group.

The aryl group having 6 to 10 carbon atoms in $R^{10}$ and $R^{11}$ is preferably a phenyl group, and more preferably a phenyl group.

The monovalent organic group including an oxetanyl group in $R^{10}$ and $R^{11}$ is preferably a group represented by the following formula (x) or a group including this group.

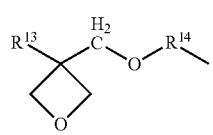

(x)

In the formula (x), $R^{13}$ is a hydrogen atom or an alkyl group having 1 to 6 carbon atoms, and $R^{14}$ is an alkylene group having 1 to 6 carbon atoms.

$R^{13}$ is preferably a hydrogen atom, a methyl group or an ethyl group, and more preferably an ethyl group.

$R^{14}$ is preferably an alkylene group having 2 to 6 carbon atoms, and more preferably a propylene group.

In the present invention, the OX group-containing cage-shaped silsesquioxane is particularly preferably a compound in which all $R^{11}$s are groups represented by the above formula (x) in the compound represented by the above formula (A1-1).

The polystyrene-converted number average molecular weight of the OX group-containing cage-shaped silsesquioxane by GPC is preferably in a range from 1,000 to 5,000, more preferably from 1,000 to 3,000, and further preferably from 1,500 to 2,500.

The composition for an organic semiconductor insulating film of the present invention may contain only one OX group-containing cage-shaped silsesquioxane or two or more thereof as the polysiloxane (A).

A production method of the OX group-containing cage-shaped silsesquioxane is not particularly limited, and the OX group-containing cage-shaped silsesquioxane can be produced by a publicly known method. Specifically, the production method described in "Synthesis and physical properties of cage-shaped silsesquioxane having oxetanyl group (OX-Q8)" (in Toagosei Group research annual report, TREND 2008, No. 11, pp. 33-39) can be applied.

<OX Group-Containing Silicon Compound>

The OX group-containing silicon compound is a compound represented by the above-indicated formula (1).

In the formula (1) according to the present description, the $SiO_{4/2}$ unit is also referred to as "Q unit"; and the $R^1$—$SiO_{3/2}$ unit is also referred to as "T unit"; the $(R^2)_2SiO_{2/2}$ unit is also referred to as "D unit"; and the $(R^3)_3SiO_{1/2}$ unit is also referred to as "M unit".

In the above formula (1), $R^1$, $R^2$ and $R^3$ are each independently a monovalent organic group including an alkyl group having 1 to 6 carbon atoms, an aralkyl group having 7 to 10 carbon atoms, an aryl group having 6 to 10 carbon atoms, a (meth)acryloyl group, an epoxy group or an oxetanyl group, provided that at least one of $R^1$, $R^2$ and $R^3$ is a monovalent organic group having an oxetanyl group.

The monovalent organic group may be merely an alkyl group having 1 to 6 carbon atoms, an aralkyl group having 7 to 10 carbon atoms, an aryl group having 6 to 10 carbon atoms or an oxetanyl group. The respective groups $R^2$ may be identical to or different from each other, and the respective groups $R^3$ may be identical to or different from each other.

The alkyl group, aralkyl group, aryl group, (meth)acryloyl group, epoxy group, and oxetanyl group in the monovalent organic group for $R^1$, $R^2$ and $R^3$ may be substituted by at least one of a halogen atom, a hydroxy group, an alkoxy group, an aryloxy group, an aralkyloxy group and an oxy group (=O).

The alkyl group having 1 to 6 carbon atoms and aralkyl group having 7 to 10 carbon atoms for $R^1$, $R^2$ and $R^3$ may be in a straight chain form or a branched form, or may have a cyclic structure.

The alkyl group having 1 to 6 carbon atoms in $R^1$, $R^2$ and $R^3$ is preferably an alkyl group having 1 to 4 carbon atoms, and more preferably a methyl group.

The aralkyl group having 7 to 10 carbon atoms in $R^1$, $R^2$ and $R^3$ is preferably a phenylalkyl group, and more preferably a benzyl group.

The aryl group having 6 to 10 carbon atoms in $R^1$, $R^2$ and $R^3$ is preferably a phenyl group, and more preferably a phenyl group.

The monovalent organic group including a (meth)acryloyl group in $R^1$, $R^2$ and $R^3$ is preferably a group represented by the following formula (2). The "(meth)acryloyl group" used in the present invention means both an acryloyl group and a methacryloyl group.

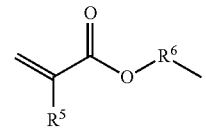

(2)

In the above formula (2), $R^5$ is a hydrogen atom or a methyl group, and $R^6$ is an alkylene group having 1 to 6 carbon atoms.

$R^6$ is preferably an alkylene group having 2 to 6 carbon atoms, and more preferably a propylene group.

The monovalent organic group including an epoxy group in $R^1$, $R^2$ and $R^3$ is preferably a glycidyloxyalkyl group.

The monovalent organic group including an oxetanyl group in $R^1$, $R^2$ and $R^3$ is preferably a group represented by the following formula (3).

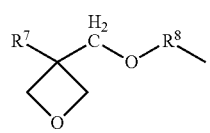

(3)

In the above formula (3), $R^7$ is a hydrogen atom or an alkyl group having 1 to 6 carbon atoms, and $R^8$ is an alkylene group having 1 to 6 carbon atoms.

$R^7$ is preferably a hydrogen atom, a methyl group or an ethyl group, and more preferably an ethyl group.

$R^8$ is preferably an alkylene group having 2 to 6 carbon atoms, and more preferably a propylene group.

In the formula (1), $R^1$, $R^2$ and $R^3$ are each independently preferably a group selected from the group consisting of an alkyl group having 1 to 6 carbon atoms, an aralkyl group having 7 to 10 carbon atoms, an aryl group having 6 to 10 carbon atoms, a monovalent organic group having a (meth) acryloyl group, a monovalent organic group having an epoxy group, a monovalent organic group having an oxetanyl group, a haloalkyl group having 1 to 6 carbon atoms, and a hydroxyalkyl group having 1 to 6 carbon atoms, more preferably a group selected from the group consisting of an alkyl group having 1 to 6 carbon atoms, an aralkyl group having 7 to 8 carbon atoms, an aryl group having 6 to 8 carbon atoms, a monovalent organic group having a (meth)acryloyl group, a monovalent organic group having an oxetanyl group, a haloalkyl group having 1 to 6 carbon atoms, and a hydroxyalkyl group having 1 to 3 carbon atoms, further preferably a group selected from the group consisting of an alkyl group having 1 to 4 carbon atoms, a group represented by the above-indicated formula (2), and a group represented by the above-indicated formula (3), and particularly a group selected from the group consisting of a methyl group, a group represented by the above-indicated formula (2), and a group represented by the above-indicated formula (3).

In the formula (1), w represents a positive number. Namely, the OX group-containing silicon compound represented by the formula (1) has at least a T unit.

Further, v, x and y in the formula (1) each independently represent 0 or a positive number, provided that at least one of v, x and y is a positive number. That is to say, the OX group-containing silicon compound has at least any of Q unit, D unit and M unit in addition to the T unit.

In the formula (1), v is preferably in a range from 0 to 5, more preferably from 0 to 4, and further preferably from 0 to 3 when w is 1.

x is preferably in a range from 0 to 10, more preferably from 0.1 to 5, and further preferably from 0.2 to 3 when w is 1.

y is preferably in a range from 0 to 5, more preferably from 0 to 3, and further preferably from 0 to 1 when w is 1.

Types of the Q unit, T unit, D unit and M unit, respectively, contained in the OX group-containing silicon compound represented by the formula (1) may be two or more.

The OX group-containing silicon compound represented by the formula (1) is preferably a compound consisting of a carbon atom, a hydrogen atom, an oxygen atom and a silicon atom.

In the present invention, the OX group-containing silicon compound preferably consists of a T unit and a D unit from the viewpoint of easiness to form an insulating film having excellent hydrophobicity and smoothness of the surface and excellent electric stability. Further, the OX group-containing silicon compound particularly preferably consists of a T unit and a D unit, the T unit having an oxetanyl group, from the viewpoint of the advantage that an insulating film having more excellent water repellency (namely, more excellent hydrophobicity of the surface).

The polystyrene-converted number average molecular weight of the OX group-containing silicon compound by GPC is preferably in a range from 500 to 5,000, more preferably from 1,000 to 3,000, and further preferably from 1,500 to 2,500.

The composition for an organic semiconductor insulating film of the present invention may contain only one OX group-containing silicon compound or two or more thereof as the polysiloxane (A).

A production method of the OX group-containing silicon compound is not particularly limited, and the OX group-containing silicon compound can be produced by a publicly known method. Specifically, production methods described in Japanese Patent No. 3653976, Japanese Patent No. 4016495, and WO 2004/076534 can be applied.

Specific example is a production method in which a silicon compound having one or more hydrolyzable group such as an alkoxy group, a cycloalkoxy group, an aryloxy group and a halogen atom, and a disiloxane compound or a silicone compound having one or more hydrolyzable group are subjected to hydrolysis and condensation.

The OX group-containing silicon compound may contain an unreacted alkoxy group and silanol derived from the monomers used in the production. Specific examples of this alkoxy group include a methoxy group, an ethoxy group, a propoxy group, an isopropoxy group, a butoxy group, and the like.

Further, the OX group-containing silicon compound may include a group which is ring-opened by addition of an acid or the like to the oxetanyl group, or a hydroxyalkyl group which is produced by decomposition of a monovalent organic group having a (meth)acryloyl group as a side chain functional group derived from the monomers used in the production.

The composition for an organic semiconductor insulating film of the present invention preferably contains the OX group-containing cage-shaped silsesquioxane as the polysiloxane (A) from the viewpoint of the advantage of allowing for the curing of the composition at a low temperature (for example, 300° C. or lower, preferably 150° C. to 250° C., and particularly 150° C. to 200° C.).

The content proportion of the polysiloxane (A) in the composition for an organic semiconductor insulating film of the present invention is preferably in a range from 10% to 90% by mass, more preferably from 20% to 80% by mass, and further preferably from 30% to 70% by mass based on 100% by mass of the entire composition for an organic semiconductor insulating film. This content proportion, when falling within the above range, provides good hydrophobicity and smoothness of the resultant insulating film, being favorable.

1-2. Organic Polymer (B)

Examples of the organic polymer (B) include polyvinylphenol (PVP), polymethylmethacrylate (PMMA), polyvinyl alcohol (PVA), polyimide, and the like.

Among these polymers, PVP is preferred from the viewpoint of excellent solvent resistance at a time of film formation of an organic semiconductor and unnecessity for heat treatment at a high temperature during the film formation.

The organic polymer (B) may be used singly or in combination of two or more types thereof.

The polystyrene-converted number average molecular weight of the organic polymer (B) by GPC is preferably in a range from 500 to 200,000, more preferably from 1,000 to 100,000, and further preferably from 1,000 to 10,000.

The content proportion of the organic polymer (B) in the composition for an organic semiconductor insulating film of the present invention preferably in a range from 10% to 90% by mass, more preferably from 20% to 80% by mass, and further preferably from 30% to 70% by mass based on 100% by mass of total amount of the polysiloxane (A) and organic polymer (B). When the content proportion of the organic polymer (B) is falling within the above range, a polysiloxane having low surface energy is easily segregated on the surface and an insulating film having more excellent hydrophobicity and smoothness can be formed, being favorable.

1-3. Curing Catalyst

A curing catalyst may be contained in the composition for an organic semiconductor insulating film of the present invention, in addition to the polysiloxane (A) and organic polymer (B).

Examples of the curing catalyst include a polymerization initiator. The polymerization initiator is preferably a cationic polymerization initiator and a radical polymerization initiator.

The cationic polymerization initiator is not particularly limited, and a publicly known compound (photocationic polymerization initiator) which produces a cation upon irradiation with light such as ultraviolet rays, and a publicly known compound (heat cationic polymerization initiator) which produces a cation upon heating can be used.

Examples of the photocationic polymerization initiator include an onium salt such as an iodonium salt, a sulfonium salt, diazonium salt, a selenium salt, a pyridinium salt, a ferrocenium salt and a phosphonium salt. Among them, an iodonium salt and a sulfonium salt are preferred.

When the photocationic polymerization initiator is an iodonium salt or a sulfonium salt, examples of the counter anion include $BF_4^-$, $AsF_6^-$, $SbF_6^-$, $PF_6^-$, $B(C_6F_5)_4^-$, and the like.

Examples of the iodonium salt include (tricumyl)iodonum tetrakis(pentafluorophenyl)borate, diphenyliodonium hexafluorophosphate, diphenyliodonium hexafluoroantimonate, diphenyliodonium tetrafluoroborate, diphenyliodonium tetrakis(pentafluorophenyl)borate, bis(dodecylphenyl)iodonium hexafluorophosphate, bis(dodecylphenyl)iodonium hexafluoroantimonate; bis(dodecylphenyl)iodonium tetrafluoroborate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate, 4-methylphenyl-4-(1-methylethyl)phenyliodonium tetrakis(pentafluorophenyl)borate, and the like.

A commercially available product can be used as the iodonium salt, and example thereof includes "UV-9380C" manufactured by GE Toshiba Silicones Co., Ltd., "RHODOSIL PHOTOINITIATOR2074" manufactured by Rhodia, "WPI-016," "WPI-116" and "WPI-113" manufactured by Wako Pure Chemical Industries, Ltd., and the like.

Examples of the sulfonium salt include bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfide bistetrafluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bishexafluoroantimonate, bis[4-(di(4-(2-hydroxyethoxy))phenylsulfonio)phenyl]sulfide bistetrafluoroborate, bis[4-(di(4-(2-hydroxyethoxy))phenylsulfonio)phenyl]sulfide tetrakis(pentafluorophenyl)borate, and the like.

A commercially available product can be used as the sulfonium salt, and example thereof includes "CYRACURE UVI-6990", "CYRACURE UVI-6992" and "CYRACURE UVI-6974" manufactured by The Dow Chemical Japan Limited, "ADEKA OPTOMER SP-150", "ADEKA OPTOMER SP-152", "ADEKA OPTOMER SP-170" and "ADEKA OPTOMER SP-172" manufactured by ADEKA CORPORATION, "WPAG-593", "WPAG-596", "WPAG-640" and "WPAG-641" manufactured by Wako Pure Chemical Industries, Ltd., and the like.

Examples of the diazonium salt include benzenediazonium hexafluoroantimonate, benzenediazonium hexafluorophosphate, benzenediazonium hexafluoroborate, and the like.

Examples of the heat cationic polymerization initiator include a sulfonium salt, a phosphonium salt, a quaternary ammonium salt, and the like. Among them, a sulfonium salt is preferred.

Examples of the counter anion in the heat cationic polymerization initiator include $AsF_6^-$, $SbF_6^-$, $PF_6^-$, $B(C_6F_5)_4^-$, and the like.

Examples of the sulfonium salt include triphenylsulfonium boron tetrafluoride, triphenylsulfonium antimony hexafluoride, triphenylsulfonium arsenic hexafluoride, tri(4-methoxyphenyl)sulfonium arsenic hexafluoride, diphenyl(4-phenylthiophenyl)sulfonium arsenic hexafluoride, and the like.

A commercially available product can be used as the sulfonium salt, and example thereof includes "ADEKA OPTON CP-66" and "ADEKA OPTON CP-77" manufactured by ADECA CORPORATION, "Sunaid SI-60L", "Sunaid SI-80L" and "Sunaid SI-100L" manufactured by SANSHIN CHEMICAL INDUSTRY CO., LTD., and the like.

Examples of the phosphonium salt include ethyltriphenylphosphonium antimony hexafluoride, tetrabutylphosphonium antimony hexafluoride, and the like.

Examples of the quaternary ammonium salt include N,N-dimethyl-N-benzylanilinium antimony hexafluoride, N,N-diethyl-N-benzylanilinium boron tetrafluoride, N,N-dimethyl-N-benzylpyrizinium antimony hexafluoride, N,N-diethyl-N-benzylpyrizinium trifluoromethanesulfonic acid, N,N-dimethyl-N-(4-methoxybenzyl)pyrizinium antimony hexafluoride, N,N-diethyl-N-(4-methoxybenzyl)pyrizinium antimony hexafluoride, N,N-diethyl-N-(4-methoxybenzyl) toluidinium antimony hexafluoride, N,N-dimethyl-N-(4-methoxybenzyl)toluidinium antimony hexafluoride, and the like.

The content proportion of the curing catalyst is not particularly limited, and can be appropriately adjusted depending on types thereof. Specifically, the content proportion is preferably in a range from 0.1 to 20 parts by mass, more preferably from 0.5 to 10 parts by mass, and further preferably from 1 to 5 parts by mass based on 100 parts by mass of the amount of the polysiloxane (A). This content proportion, when falling within the above range, is preferred since curing rapidly proceeds.

1-4. Solvent

A solvent may be contained in the composition for an organic semiconductor insulating film of the present invention in addition to the polysiloxane (A) and organic polymer (B).

The solvent is not particularly limited, and is preferably a solvent which can dissolve the polysiloxane (A), organic polymer (B) and other components.

Examples of the solvent include an alcohol such as methanol, ethanol, isopropyl alcohol and isobutyl alcohol; an alkylene glycol monoalkyl ether such as propylene glycol monomethyl ether; an aromatic compound such as toluene and xylene; an ester such as propylene glycol monomethyl ether acetate, ethyl acetate and butyl acetate; a ketone such as acetone, methylethylketone and methylisobutylketone; an ether such as dibutyl ether; N-methylpyrrolidone, and the like. The solvent may be used singly or in combination of two or more types thereof.

A reaction solvent at a time of synthesis of the polysiloxane (A) may be used, as it is, as the solvent in the composition. This case brings about the advantage that the production cost can be lowered.

When a solvent is contained in the composition for an organic semiconductor insulating film, the sum of the solid concentrations of the polysiloxane (A) and organic polymer (B) is preferably 0.1% or more by mass.

The composition for an organic semiconductor insulating film of the present invention can also be a solvent-free composition.

1-5. Other Components

Other components may be contained, within a range not inhibiting the effect of the present invention, in the composition for an organic semiconductor insulating film of the present invention in addition to the polysiloxane (A) and organic polymer (B).

Specific other components include a polymerizable unsaturated compound, a radical polymerization inhibitor, an antioxidant, an ultraviolet absorber, a light stabilizer, a leveling agent, an organic polymer, a filler, a metal particle, a pigment, a polymerization initiator, a sensitizer, and the like. These other components may be used singly or in combination of two or more types thereof.

1-6. Preparation of Composition for Organic Semiconductor Insulating Film

The composition for an organic semiconductor insulating film of the present invention can be obtained by mixing starting material components. A publicly known mixer or the like may be used when such components are mixed. Specific example includes a reaction flask, a change can type mixer, a planetary mixer, a disper, a Henschel mixer, a kneader, an ink roll, an extruder, a triple roll mill, a sand mill and the like.

2. Organic Semiconductor Insulating Film

The organic semiconductor insulating film of the present invention is characterized in that the film is produced by using the above-mentioned composition for an organic semiconductor insulating film.

Hereinafter, a process for forming an organic semiconductor insulating film is specifically explained.

Firstly, the composition for an organic semiconductor insulating film is applied onto a substrate. An application method at this time is not particularly limited, and examples thereof can include a spin coating method, a spin casting method, a die coater method, a screen printing method, an ink jet method, and the like.

Subsequently, the resultant coating is dried and cured to form an insulating film. Drying method is not particularly limited, and can be carried out by heating treatment. Curing method is not particularly limited, and curing can be carried out by light exposure treatment with a high pressure mercury lamp or radiation, heating treatment and the like.

The thus-formed organic semiconductor insulating film can be used as a gate insulating layer, for example, in an organic field effect transistor including a substrate, a gate electrode, a gate insulating layer, an organic active layer and source/drain electrodes.

The structure of the transistor is not particularly limited, and the organic semiconductor insulating film can be applied to all of conventionally-known structures.

The substrate is not particularly limited, and example of the material includes glass, silicon wafer, polyethylene terephthalate, polycarbonate, polyethersulfone, polyethylene naphthalate, and the like.

A material for forming the organic active layer is not particularly limited, and example thereof includes pentacene, copper phthalocyanine, polythiophene, polyaniline, polyacetylene, polypyrrole, polyphenylene vinylene, derivatives thereof, and the like.

Further, commonly-used metals or conductive polymers can be used as the gate electrode, source electrode and drain electrode, respectively, without any particular limitation. Specifically, gold, silver, aluminum, nickel, indium tin oxides, polythiophene, polyaniline, polyacetylene, polypyrrole, polyphenylene vinylene, PEDOT/PSS, and the like can be used.

EXAMPLES

Hereinafter, the present invention is specifically described using Examples. The present invention is not limited to the Examples.

1. Preparation of Composition for Organic Semiconductor Insulating Film

Example 1

226 mg of an OX group-containing cage-shaped silsesquioxane represented by the following formula (A-1) having a number average molecular weight of 2,000 (hereinafter, also referred to as "OX-Q8") and 224 mg of polyvinylphenol (PVP) were dissolved in 1.76 g of propylene glycol monomethyl ether acetate (PGMEA), thereby producing a mixed solution (solid concentration: 20% by weight). Subsequently, 45 mg of tolylcumyliodonium tetrakis(pentafluorophenyl)borate as a photoacid generator (photopolymerization initiator) was formulated into this solution, and then the mixture was filtered through a filter having a pore diameter of 450 nm to prepare a composition for an organic semiconductor insulating film of Example 1.

The OX group-containing cage-shaped silsesquioxane was obtained by using the production method described in "Synthesis and physical properties of cage-shaped silsesquioxane having oxetanyl group (OX-$Q_8$)" (in Toagosei Group research annual report, TREND 2008, No. 11, pp. 33-39).

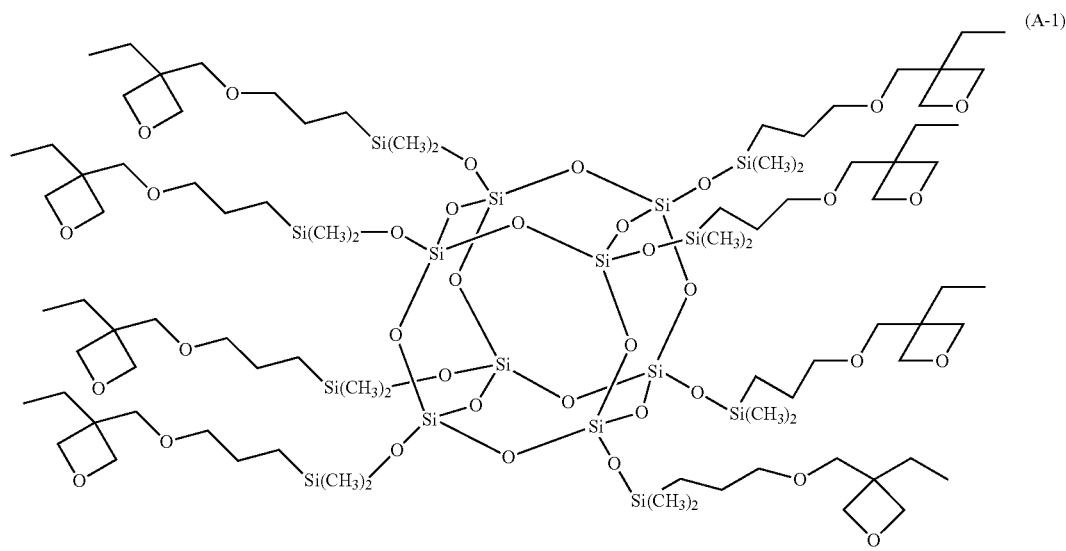

(A-1)

Example 2

225 mg of an OX group-containing silicon compound having a composition as shown in Table 1 [as for w and x, see the formula (1)] (hereinafter, also referred to as "OX-SQ SI-20") and 225 mg of polyvinylphenol (PVP) were dissolved in 1.75 g of propylene glycol monomethyl ether acetate (PGMEA), thereby producing a mixed solution (solid concentration: 20% by weight). Subsequently, 45 mg of tolylcumyliodonium tetrakis(pentafluorophenyl)borate as a photoacid generator was formulated into solution, and then the mixture was filtered through a filter having a pore diameter of 450 nm to prepare a composition for an organic semiconductor insulating film of Example 2.

The OX group-containing silicon compound was obtained by using the production method described in Japanese Patent No. 3843575.

Comparative Example 1

226 mg of an OX group-containing polysiloxane having a composition as shown in Table 1 [as for w and x, see the formula (1)] (hereinafter, also referred to as "OX-SQ TX-100") and 225 mg of polyvinylphenol (PVP) were dissolved in 1.76 g of propylene glycol monomethyl ether acetate (PGMEA), thereby producing a mixed solution (solid concentration: 20% by weight). Subsequently, 44 mg of tolylcumyliodonium tetrakis(pentafluorophenyl)borate as a photoacid generator was formulated into this solution, and then the mixture was filtered through a filter having a pore diameter of 450 nm to prepare a composition for an organic semiconductor insulating film of Comparative Example 1.

The OX group-containing silicon compound was obtained by using the production method described in Japanese Patent No. 3653976.

TABLE 1

| | Compositional ratio of polysiloxane (molar ratio) | | Number average molecular weight (Mn) |
|---|---|---|---|
| | w<br>T unit<br>OX—SiO$_{3/2}$ | x<br>D unit<br>[(CH$_3$)$_2$SiO$_{2/2}$]$_n$ | |
| Example 2 | 1 | 20 wt % of product = 0.706 | 1600 |
| Comparative Example 1 | 1 | — | 2000 |

Abbreviation of the polysiloxane structure shown in Table 1 is as follows.

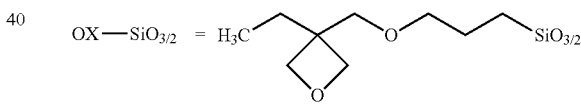

2. Evaluation of Composition for Organic Semiconductor Insulating Film

The respective compositions for an organic semiconductor insulating film of Examples 1 and 2 and Comparative Example 1 were subjected to the following performance test and performance evaluation. The results are indicated in Table 2.

2-1. Thin Film Formability

The composition for an organic semiconductor insulating film was spin-coated on a silicon wafer by using a semiconductor producing device "1H-DXII" (type name) manufactured by MIKASA Co., Ltd. at a rotation speed of 500 rpm for 10 seconds and further at 1,500 rpm for 30 seconds. After light exposure using a high pressure mercury lamp for 30 seconds, the coating was heated at a temperature of 150° C. for 1 hour to produce a thin film having a thickness of 1.5 μm.

A case where a thin film could be formed without any problem was ranked as "o", and a case where a thin film could not be formed was ranked as "x".

2-2. Pattern Formability

The composition for an organic semiconductor insulating film was spin-coated on a silicon wafer in a similar manner as those in the above item 2-1. The coating was exposed via a photo mask using a high pressure mercury lamp for 30 seconds, and then heated at a temperature of 150° C. for 2 minutes to obtain a 250-μm line and space pattern. After cooling, development was conducted using butyl acetate as a developing liquid, and rinsed. The resultant film was heated at 150° C. for 1 hour, thereby obtaining a line and space pattern.

A case where a 250-μm line and space pattern could be formed without any problem was ranked as "o", and a case where a 250-μm line and space pattern could not be formed was ranked as "x".

2-3. Solvent Resistance

The composition for an organic semiconductor insulating film was used to produce a thin film having a thickness of 1.5 μm in a similar manner as those in the above item 2-1.

After that, the solvent resistance was evaluated in the following manner.

Acetone and butyl acetate were used as organic solvents, and they were dropped onto the thin film for visual confirmation.

A case where the thin film was insoluble in both the solvents was ranked as "o", and a case where the thin film was soluble in both the solvents was ranked as "x".

2-4. Transparency

The composition for an organic semiconductor insulating film was used to produce a thin film having a thickness of 1.5 μm in a similar manner as those in the above item 2-1.

After that, the transparency was evaluated in the following manner.

The thin film combined with quartz substrates was measured in terms of transmittance by ultraviolet visible absorption spectrum.

A case where the transmittance of the entire visible region was 95% or more was ranked as "o", and a case where the transmittance of the entire visible region was less than 95% was ranked as "x".

2-5. Water Repellency (Hydrophobicity)

The composition for an organic semiconductor insulating film was used to produce a thin film having a thickness of 1.5 μm in a similar manner as those in the above item 2-1.

The water contact angle of the thin film was measured to evaluate the water repellency in the following manner.

Pure water was dropped, and measurement was carried out five times to take average values.

A case where the water contact angle was 90 degrees or more was ranked as "o", and a case where the water contact angle was less than 90 degrees was ranked as "x".

Note that the water contact angle of a thin film consisting of PVP alone, which was used as a conventional insulating film, under the same conditions was 59 degrees (Reference Example 1).

2-6. Smoothness

The composition for an organic semiconductor insulating film was used to produce a thin film having a thickness of 1.5 μm in a similar manner as those in the above item 2-1.

An atomic force microscope "SPM-9600" (type name) manufactured by Shimadzu Corporation was used to evaluate the smoothness of the thin film in the following manner.

A case where the maximum unevenness difference was 10 nm or less and the average surface roughness was 0.5 nm or less was ranked as "o", and a case where the maximum unevenness difference exceeded 10 nm or the average surface roughness exceeded 0.5 nm was ranked as "x".

2-7. Electric Property

Aluminum was deposited on a surface of a glass substrate having a size of 30 mm×30 mm×1.8 mm to form an evaporated film having a thickness of 0.1 μm to 0.3 μm. After that, the composition for an organic semiconductor insulating film was used to produce a thin film having a thickness of 1.5 μm in a similar manner as those in the above item 2-1. Then, aluminum was further deposited on the thin film to form an evaporated film having a thickness of 0.1 μm to 0.3 μm, thereby producing a sandwich electrode.

Subsequently, the resultant electrode was used to carry out dielectric constant measurement by an impedance analyzer "4284A PRECISION LCR METER" (type name) manufactured by HEWLETT PACKARD. The results of the measurement are shown in Table 1 and FIG. 1.

A case where the dielectric constant was less dependent on the frequency within a range from the low-frequency region to the high-frequency region was ranked as "o", and a case where the frequency dependency thereof was observed was ranked as "x".

TABLE 2

|  | Example 1 | Example 2 | Comparative Example 1 |
|---|---|---|---|
| Thin film formability | o | o | o |
| Pattern formability | o | o | o |
| Solvent resistance | o | o | o |
| Transparency | o | o | o |
| Hydrophobicity | o | o | x |
| Smoothness | o | o | o |
| Electric property (dielectric constant; KHz) | o(5.9) | o(5.5) | o(5.9) |

As is clearly from results in Table 2, it could be confirmed that the respective compositions of Examples 1 and 2 led to insulating films having excellent thin film formability, pattern formability, solvent resistance and transparency. Especially, the composition of Example 1 could be used to form a thin film at a low temperature of 150° C.

Further, it could be confirmed that the respective compositions of Examples 1 and 2 led to insulating films having excellent hydrophobicity and smoothness of the surface.

Especially, in view of the fact that the water contact angle of a thin film consisting of PVP alone, which was used in a conventional insulating film, under the same conditions was 59 degrees (Reference Example 1), the insulating films produced by using the compositions of the respective Examples are excellent in hydrophobicity. It can be inferred that this is caused by decrease in hydroxyl groups by reacting the hydroxyl groups in PVP and the oxetanyl groups in the polysiloxane.

On the other hand, hydrophobicity was poor when the composition of Comparative Example 1 was used. It can be inferred that this was caused by a large amount of residual silanol at the time of the condensation reaction in the polysiloxane production.

It is considered that the fact that the polysiloxane of Example 1 is different from that of Comparative Example 1 in synthesis method and has a complete cage-shaped structure, and thus generates no residual silanol is also caused by a high water contact angle. When a water-repellent polysiloxane backbone (D unit silicone) has been introduced as in Example 2, it is considered that functional groups having low surface energy are surface-segregated, thereby providing a high water contact angle.

Further, according to Table 2 and FIG. 1, the dielectric constants (1 KHz) of the respective thin films obtained by using the respective compositions of Examples 1 and 2 and Comparative Example 1 are 5.9, 5.5 and 5.9, respectively, and it could be confirmed that, while a slight increase in dielectric constant was observed within the low-frequency region, they did not show frequency dependency of their dielectric constant, and were thin films having less ion impurities.

In view of the above, it could be confirmed that the thin films (insulating films) obtained by using the compositions of Examples 1 and 2 had excellent hydrophobicity and smoothness of the surface and excellent electric stability.

In contrast, the use of the composition of Comparative Example 1 resulted in poor hydrophobicity of the surface because of a large amount of residual silanol at the time of polysiloxane synthesis. In the meantime, it is considered that an insulating film, when formed by using the composition of Comparative Example 1, does not have sufficient hydrophobicity, so that the polar groups on the surface thereof trap an electric charge which may cause defects in hysteresis and the like.

3. Transistor Characteristics

Figure 2:
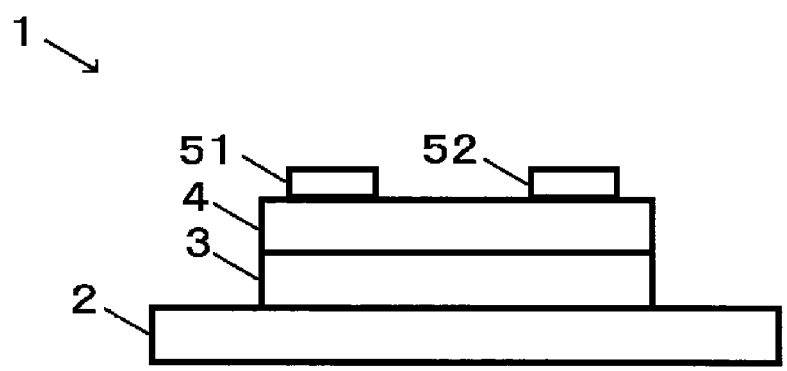
FIG. 2 is a schematical view for explaining the configuration of a transistor.

The composition for an organic semiconductor insulating film of Example 1 was used in the following manner to produce a transistor 1 having a configuration as shown in FIG. 2, and its transistor characteristics were evaluated.

Firstly, the composition for an organic semiconductor insulating film of Example 1 was used in a similar manner as those in the above item 2-1 to produce a thin film having a thickness of 1.5 μm on a 300 nm thickness silicon oxide layer formed on a silicon wafer 2. The thin film was then exposed for 30 seconds and heated at a temperature of 150° C. for 1 hour to be cured, thereby forming an insulating film 3.

Subsequently, a chloroform solution containing 1% by weight of poly 3-hexylthiophene was spin-coated onto the insulating film 3 at a rotation speed of 500 rpm for 10 seconds and at 2,000 rpm for 20 seconds, thereby forming a semiconductor layer 4 having a thickness of 0.1 to 0.2 μm.

After 1-hour heating at 100° C., gold was deposited so as to attain a channel length of 50 μm and a channel width of 3 mm to form source-drain electrodes 51, 52, thereby producing a transistor 1 for testing.

Note that the entire silicon wafer 2 serves as a gate electrode in the transistor 1 having this configuration.

<Output Characteristic of Transistor>

Measurement method is as follows. The gate voltage was changed from 0 V to −30 V and the drain voltage was changed from 10 V to −30 V to measure a current value between the source and the drain.

The results of this measurement are shown in FIG. 3.

<Transmission Characteristic of Transistor>

Measurement method is as follows. The drain voltage was defined as −30 V and the gate voltage was changed from 0 V to −30 V to measure a current value.

Figure 4:
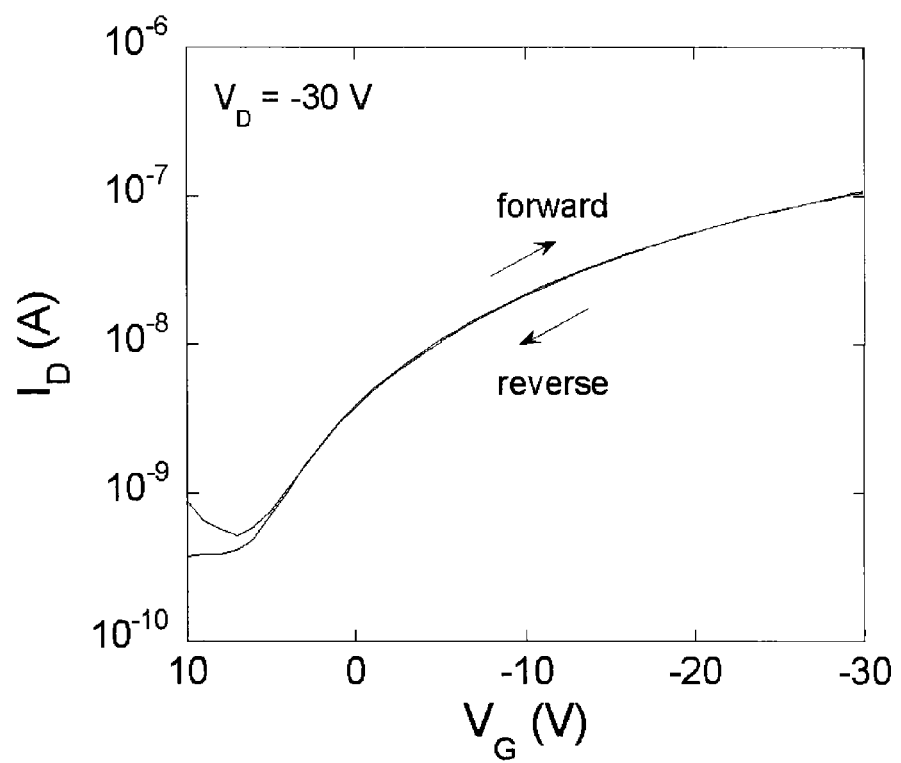
FIG. 4 is a graph showing a transistor characteristic (transmission characteristic).

The results of this measurement are shown in FIG. 4.

As shown in FIG. 3 (output characteristic), it could be confirmed that, when the gate voltage was changed from 0 V to −30 V, the power flowing between the source and the drain increased with the increase in applied voltage, and thus that the transistor 1 functioned as a transistor.

Further, as shown in FIG. 4 (transmission characteristic), it could be confirmed that a current change could be confirmed between when voltage was applied and when no voltage was applied, and thus that the transistor 1 functioned as switching.

In the meantime, no current change was observed between in the case where the voltage was changed from 10 V to −30 V and in the case where the voltage was changed from −30 V to 0 V, and no hysteresis was observed. This is considered to be caused by the fact that ion impurities were present only in small quantity, as confirmed from the frequency dependency of the dielectric constant of the thin film (insulating film) obtained from the composition of Example 1. Further, this is considered to be caused by the fact that polar groups which trap an electric charge on the insulating film surface were present in extremely small quantity due to the cage-shaped structure, as confirmed from the constant angle measurement.

The field effect mobility calculated from the measurement data on the above transistor characteristics was $6.2 \times 10^{-4}$ $cm^2 \cdot V^{-1} \cdot s^{-1}$, the threshold value was 5.9 V, and the on/off ratio was $2 \times 10^2$.

Accordingly, it could be confirmed that the composition of Example 1 led to a film excellent in hydrophobicity and smoothness of the surface and excellent in electric stability, and adequately functioned as an insulating film in an organic semiconductor.

The composition of Example 2 also led to a film excellent in hydrophobicity and smoothness of the surface and excellent in electric stability, and thus is considered to adequately function as an insulating film in an organic semiconductor.

Further, the insulating films obtained from the respective compositions of Examples 1 and 2 includes a hybrid of an organic polymer with an inorganic polymer, and therefore grant of new physical properties and regulation are made possible.

EXPLANATION OF THE REFERENCE NUMBERS

1: Transistor
2: Silicon wafer
3: Insulating film
4: Semiconductor layer
51: Source electrode
52: Drain electrode

What is claimed is:

1. A composition, comprising: (A) a polysiloxane, and (B) an organic polymer compound,
wherein
the polysiloxane (A) is at least one of a cage-shaped silsesquioxane comprising an oxetanyl group, and a silicon compound comprising an oxetanyl group and represented by formula (1):

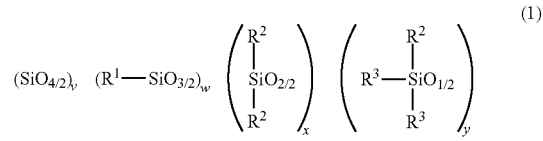

wherein
each $R^1$, each $R^2$ and each $R^3$ independently represent a monovalent organic group comprising an alkyl group comprising 1 to 6 carbon atoms, an aralkyl group comprising 7 to 10 carbon atoms, an aryl group comprising 6 to 10 carbon atoms, a (meth)acryloyl group, an epoxy group or an oxetanyl group, with the proviso that at least one of $R^1$, $R^2$ and $R^3$ is a monovalent organic group comprising an oxetanyl group;
the monovalent organic group is optionally substituted by a halogen atom, a hydroxy group, an alkoxy group, an aryloxy group, an aralkyloxy group or an oxy group;
w represents a positive number; and
v, x and y each independently represent 0 or a positive number, with the proviso that at least one of v, x and y is a positive number,
wherein the organic polymer compound (B) comprises a polyvinylphenol, and the composition is suitable for an organic semiconductor insulating film.

2. The composition according to claim 1, further comprising a curing catalyst.

3. The composition according to claim 2, wherein the curing catalyst is a photocationic polymerization initiator.

4. The composition according to claim 3, wherein the photocationic polymerization initiator is at least one compound selected from the group consisting of an iodonium salt, a sulfonium salt, a diazonium salt, a selenium salt, a pyridinium salt, a ferrocenium salt, and a phosphonium salt.

5. The composition according to claim 2, wherein a content of the curing catalyst is in a range of from 1 to 20 parts by mass based on a total mass of the polysiloxane (A).

6. An organic semiconductor film produced by a method comprising: employing the composition according to claim 1 into the organic semiconductor film.

7. The organic semiconductor film according to claim 6, wherein the method comprises:
coating the composition, which further comprises a curing catalyst, onto a substrate, thereby obtaining a coating, drying the coating, and
then exposing or heating the coating.

8. The composition according to claim 1, wherein the polysiloxane (A) comprises a compound represented by formula (A1):

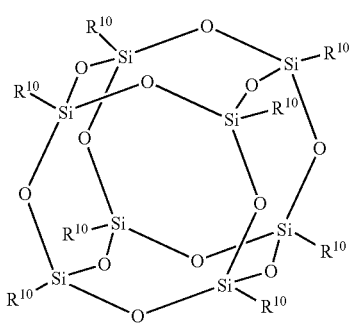

(A1)

wherein
each $R^{10}$ is independently a monovalent organic group comprising an alkyl group comprising 1 to 6 carbon atoms, an aralkyl group comprising 7 to 10 carbon atoms, an aryl group comprising 6 to 10 carbon atoms, a (meth)acryloyl group, an epoxy group or an oxetanyl group, with the proviso that at least one $R^{10}$ is a monovalent organic group comprising an oxetanyl group; and
the monovalent organic group is optionally substituted by a halogen atom, a hydroxy group, an alkoxy group, an aryloxy group, an aralkyloxy group or an oxy group.

9. The composition according to claim 1, wherein a content of the organic polymer compound (B) is in a range of from 10% to 90% by mass based on a total mass of the polysiloxane (A) and the organic polymer compound (B).

10. The composition according to claim 1, wherein the polysiloxane (A) comprises a compound represented by formula (A1-1):

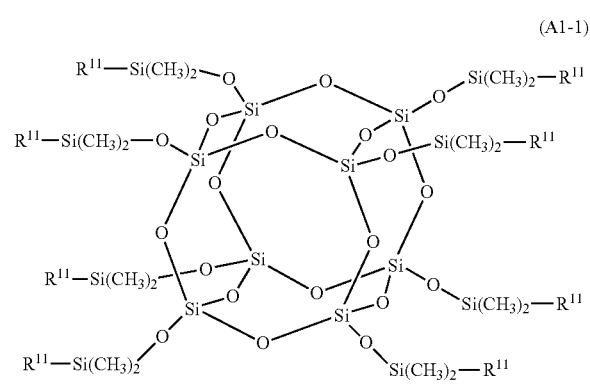

(A1-1)

wherein
each $R^{11}$ is independently a monovalent organic group comprising an alkyl group comprising 1 to 6 carbon atoms, an aralkyl group comprising 7 to 10 carbon atoms, an aryl group comprising 6 to 10 carbon atoms, or an oxetanyl group, with the proviso that at least one $R^{11}$ is a monovalent organic group comprising an oxetanyl group; and
the monovalent organic group is optionally substituted by a halogen atom, a hydroxy group, an alkoxy group, an aryloxy group, an aralkyloxy group or an oxy group.

11. The composition according to claim 1, wherein the polysiloxane (A) is the cage-shaped silsesquioxane comprising an oxetanyl group.

12. The composition according to claim 1, wherein the polysiloxane (A) is the silicon compound comprising an oxetanyl group and represented by the formula (1).

* * * * *